US010517184B2

(12) United States Patent
Treible, Jr. et al.

(10) Patent No.: US 10,517,184 B2
(45) Date of Patent: Dec. 24, 2019

(54) CONFIGURABLE ELECTRONICS PACKAGES

(71) Applicant: Eaton Intelligent Power Limited, Dublin (IE)

(72) Inventors: Daniel Robert Treible, Jr., Liverpool, NY (US); Adikaramge Asiri Jayawardena, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/893,314

(22) Filed: Feb. 9, 2018

(65) Prior Publication Data
US 2019/0254187 A1 Aug. 15, 2019

(51) Int. Cl.
| H05K 5/02 | (2006.01) |
| H01R 29/00 | (2006.01) |
| H05K 7/14 | (2006.01) |
| H05K 7/02 | (2006.01) |
| H02J 50/10 | (2016.01) |

(52) U.S. Cl.
CPC ........... *H05K 5/0256* (2013.01); *H01R 29/00* (2013.01); *H05K 7/023* (2013.01); *H05K 7/1427* (2013.01); *H02J 50/10* (2016.02)

(58) Field of Classification Search
CPC .... H05K 5/0256; H05K 7/1427; H05K 7/023; H01R 29/00; H02J 50/10
See application file for complete search history.

(56) References Cited

U.S. PATENT DOCUMENTS

| 3,264,526 A | 8/1966 | Wiggerman |
| 4,283,758 A | 8/1981 | Irving |
| 4,463,398 A | 7/1984 | Boozer et al. |
| 4,463,399 A | 7/1984 | Matherly et al. |
| 4,918,572 A | 4/1990 | Tarver et al. |
| 5,739,463 A | 4/1998 | Diaz et al. |
| 5,821,695 A | 10/1998 | Vilanilam et al. |

(Continued)

FOREIGN PATENT DOCUMENTS

| CN | 201652150 | 11/2010 |
| EP | 2989385 | 3/2016 |

(Continued)

OTHER PUBLICATIONS

Machine translation of CN201652150 via Google Patents, 6 pages, Oct. 5, 2017.

(Continued)

*Primary Examiner* — Rockshana D Chowdhury
(74) *Attorney, Agent, or Firm* — King & Spalding LLP

(57) ABSTRACT

An electrical device can include a first housing having at least one wall that forms a first cavity, where the first cavity formed by the at least one wall has a first shape and a first size. The electrical device can also include multiple configurable electronics packages disposed within the first cavity, where the configurable electronics packages are connected to each other and positioned in a first orientation within the first cavity. The configurable packages can be configured to be connected to each other and positioned in a second orientation within a second cavity of a second housing, where the second cavity has a second shape and a second size.

18 Claims, 9 Drawing Sheets

(56) References Cited

U.S. PATENT DOCUMENTS

| | | | |
|---|---|---|---|
| 6,219,258 B1 | 4/2001 | Denzene et al. | |
| 7,058,250 B2 | 6/2006 | Bachl et al. | |
| 7,322,873 B2* | 1/2008 | Rosen | A63H 33/042 |
| | | | 446/124 |
| 7,868,903 B2 | 1/2011 | Wendler et al. | |
| 8,292,449 B2 | 10/2012 | Poissonnet et al. | |
| 8,480,249 B2 | 7/2013 | Curran et al. | |
| 8,552,928 B2 | 10/2013 | Wendler et al. | |
| 8,873,239 B2* | 10/2014 | McRae | G06F 1/1656 |
| | | | 361/728 |
| 8,919,999 B2 | 12/2014 | Zimmerman et al. | |
| 9,052,092 B2 | 6/2015 | Wendler et al. | |
| 9,285,109 B1 | 3/2016 | Olsson et al. | |
| 9,386,698 B2 | 7/2016 | Ikeda | |
| 9,755,356 B1 | 9/2017 | Kim et al. | |
| 10,148,051 B2* | 12/2018 | Wilcock | H05K 1/0313 |
| 2011/0097996 A1* | 4/2011 | Kalanithi | H04B 5/0043 |
| | | | 455/41.1 |
| 2011/0103050 A1 | 5/2011 | Hochman | |
| 2012/0176795 A1 | 7/2012 | Lynch | |
| 2014/0169486 A1* | 6/2014 | McCormack | G09G 3/2096 |
| | | | 375/259 |
| 2015/0009639 A1* | 1/2015 | Papakos | H05K 7/1424 |
| | | | 361/752 |
| 2015/0356051 A1 | 12/2015 | Benson et al. | |
| 2016/0084490 A1 | 3/2016 | Davis et al. | |
| 2016/0085022 A1 | 3/2016 | Yang et al. | |
| 2016/0149426 A1* | 5/2016 | Hodges | G06F 1/1632 |
| | | | 320/108 |
| 2016/0286648 A1* | 9/2016 | Chu | H05K 1/144 |
| 2016/0374223 A1* | 12/2016 | Xu | H05K 3/30 |
| 2017/0051910 A1 | 2/2017 | Woytowitz et al. | |

FOREIGN PATENT DOCUMENTS

| | | |
|---|---|---|
| FR | 2423719 | 9/1981 |
| WO | WO 2002/027437 A2 | 4/2002 |
| WO | WO 2002/027437 A3 | 4/2002 |
| WO | WO 2010/088695 A1 | 8/2010 |
| WO | WO 2012/026911 A1 | 3/2012 |
| WO | 2017133793 | 8/2017 |

OTHER PUBLICATIONS

Machine translation of FR2423719 via LexsisNexsis Total Patents, 9 pages, Oct. 20, 2017.

Extended European Search Report issued in EP19155616, dated Jul. 12, 2019, 8 pages.

* cited by examiner

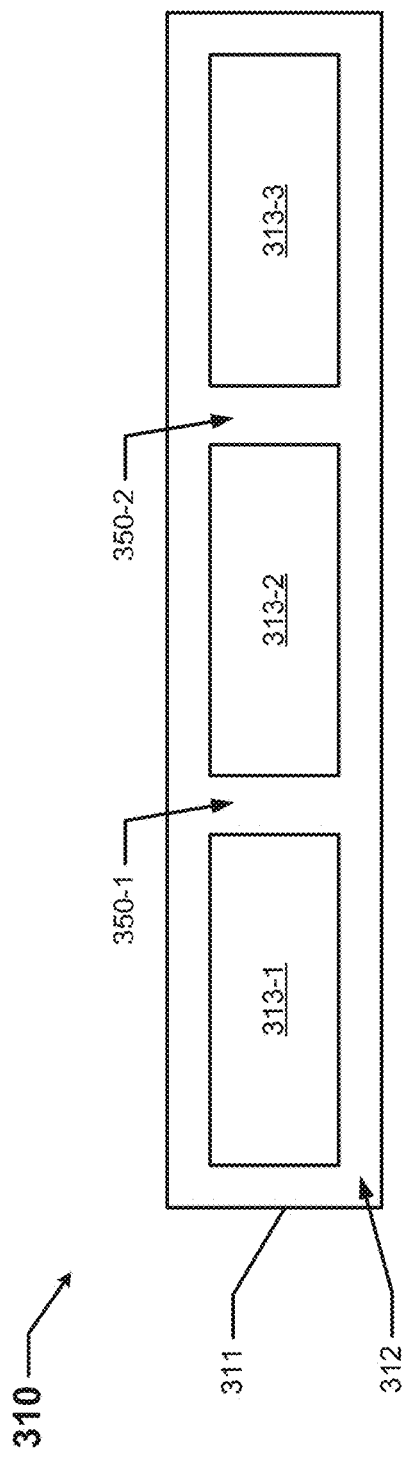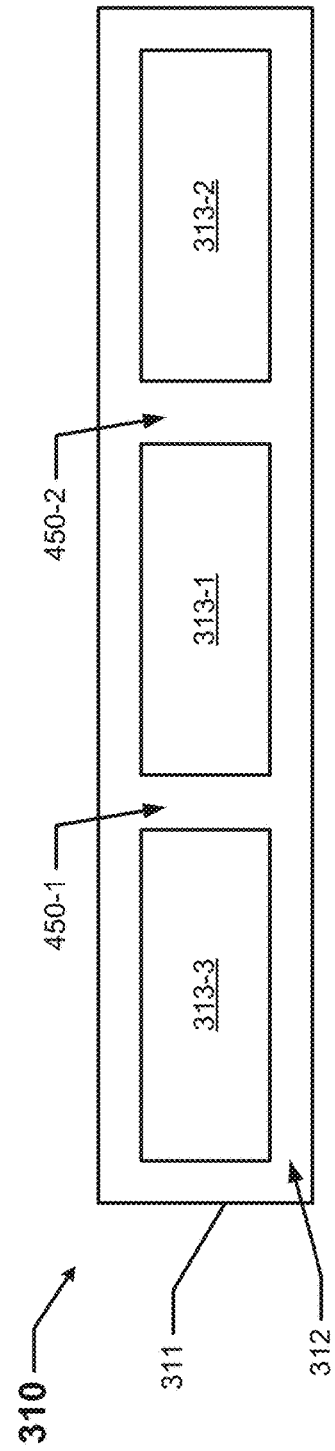

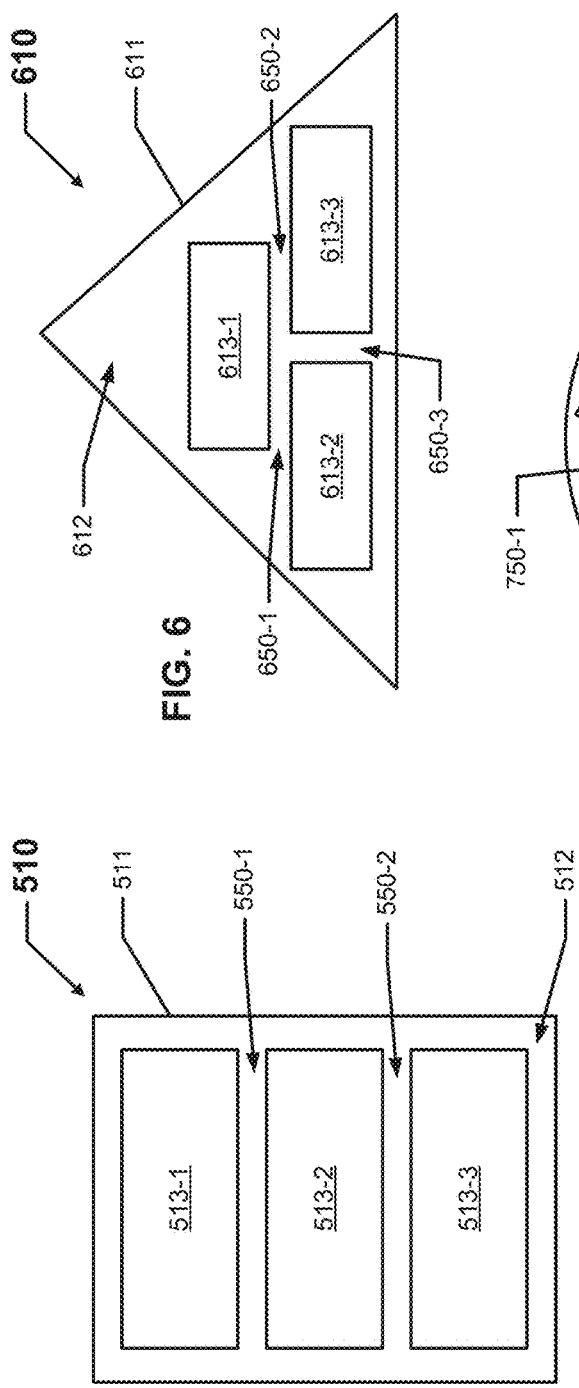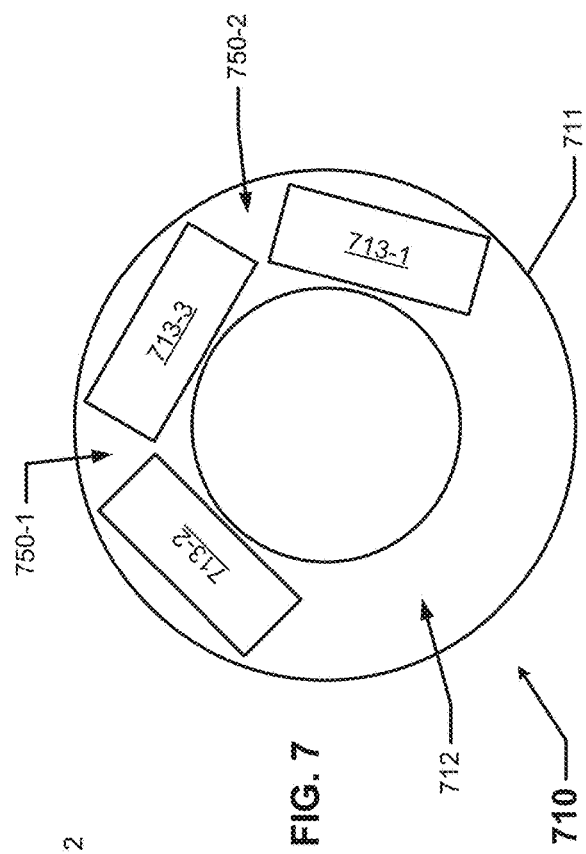

CONFIGURABLE ELECTRONICS PACKAGES

TECHNICAL FIELD

The present disclosure relates generally to electronics packages, and more particularly to systems, methods, and devices for configurable electronics packages.

BACKGROUND

Light fixtures and other electrical devices often house electronics that perform one or more different functions. Examples of such functions can include providing power, providing control, providing communications, and providing sensing capability. Two or more of these various functions can be located on the same circuit board or electronics package. Alternatively, each of these functions can be located on its own circuit board or electronics package.

SUMMARY

In general, in one aspect, the disclosure relates to an electrical device. The electrical device can include a first housing having at least one wall that forms a first cavity, where the first cavity formed by the at least one wall has a first shape and a first size. The electrical device can also include multiple configurable electronics packages disposed within the first cavity, where the configurable electronics packages are connected to each other and positioned in a first orientation within the first cavity. The multiple configurable packages can be configured to be connected to each other and positioned in a second orientation within a second cavity of a second housing, where the second cavity has a second shape and a second size.

In another aspect, the disclosure can generally relate to a configurable electronics package for an electrical device. The configurable electronics package can include a circuit board, and multiple electrical components disposed on the circuit board, where the electrical components serve a function for the electrical device. The configurable electronics package can also include at least one connector that is configured to connect to at least one complementary connector of at least one additional configurable electronic package, where the at least one additional configurable electronic package serves at least one additional function for the electrical device. The circuit board, the electrical components, and the at least one connector can be configured to be disposed within a housing of the electrical device.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

FIG. 3 shows a cross-sectional side view of an electrical enclosure with configurable electronics packages in accordance with certain example embodiments.

FIG. 4 shows a cross-sectional side view of the electrical enclosure of FIG. 3 with a different arrangement of the configurable electronics packages in accordance with certain example embodiments.

FIG. 5 shows a cross-sectional side view of still another electrical enclosure with configurable electronics packages in accordance with certain example embodiments.

FIG. 6 shows a cross-sectional side view of yet another electrical enclosure with configurable electronics packages in accordance with certain example embodiments.

FIG. 7 shows a cross-sectional side view of still another electrical enclosure with configurable electronics packages in accordance with certain example embodiments.

DETAILED DESCRIPTION

Figure 1:
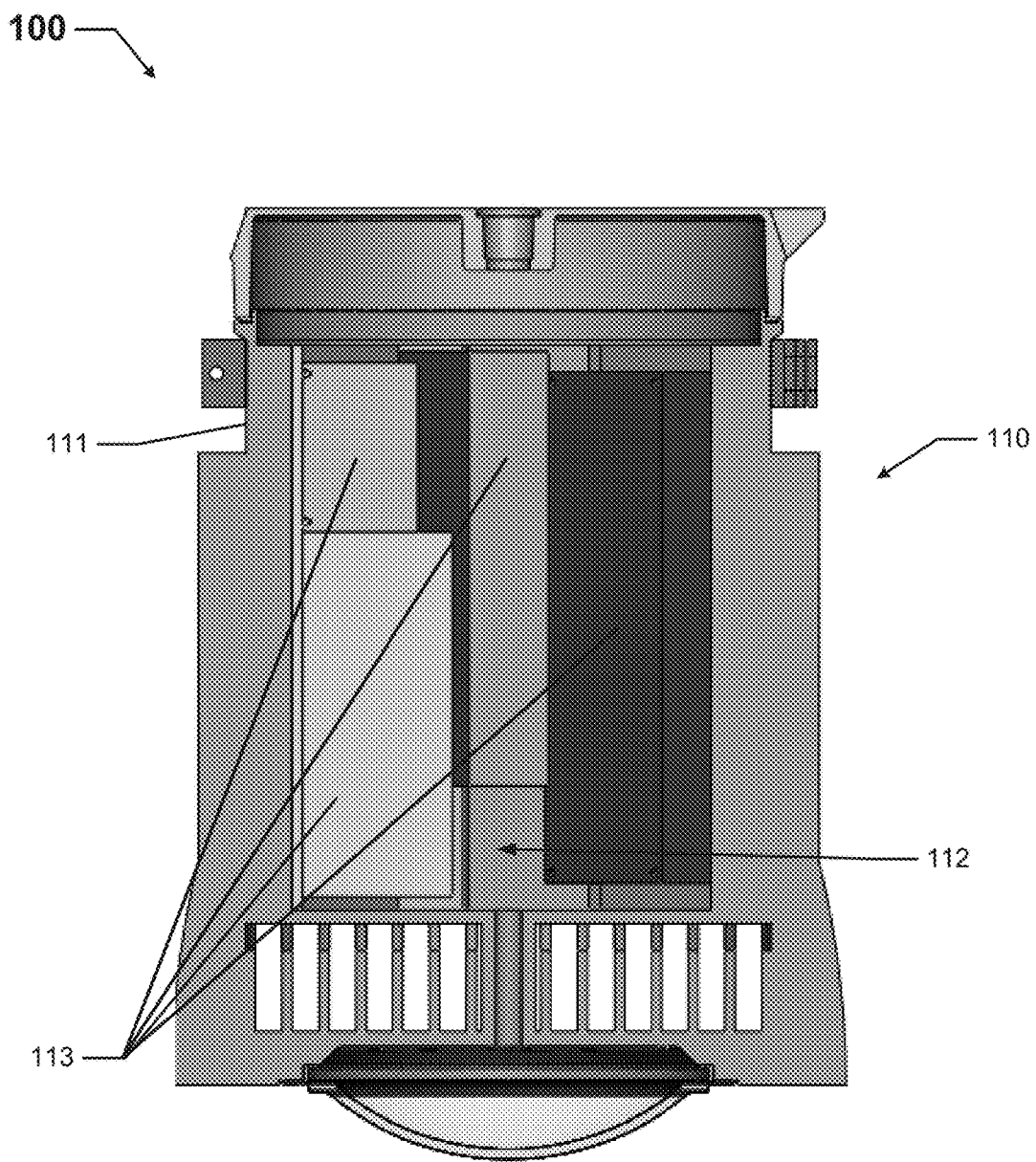
FIG. 1 shows a cross-sectional side view of an electrical device currently used in the art.

In general, example embodiments provide systems, methods, and devices for configurable electronics packages. Example configurable electronics packages can be disposed in any of a number of housings (also called enclosures or electrical enclosures herein) of any of a number of electrical devices. While example electrical devices shown and described herein are directed to housings of light fixtures, example embodiments can be used with housings of other electrical devices. Such other electrical devices can include, but are not limited to, a junction box, a computer, a clock, a set top box, a DVD player, a television, a thermostat, a sensor, and a motor controller.

The electrical devices for which example embodiments are used can be located in any type (e.g., indoors, outdoors, cold, hot, humid) of environment. In some cases, the example embodiments discussed herein can be used in any type of hazardous environment, including but not limited to an airplane hangar, a drilling rig (as for oil, gas, or water), a production rig (as for oil or gas), a refinery, a chemical plant, a power plant, a mining operation, a wastewater treatment facility, and a steel mill. A user may be any person that interacts with electrical devices. Examples of a user may include, but are not limited to, an engineer, an electrician, an instrumentation and controls technician, a mechanic, an operator, a consultant, an inventory management system, an inventory manager, a foreman, a labor scheduling system, a contractor, a homeowner, a business owner, and a manufacturer's representative.

The example configurable electronics packages described herein can be made of one or more of a number of suitable materials to allow the electrical device and/or other associated components of a system to meet certain standards and/or regulations while also maintaining reliability in light of the one or more conditions under which the electrical device and/or other associated components of the system can be exposed. Examples of such materials can include, but are not limited to, aluminum, stainless steel, fiberglass, glass, plastic, potting material, ceramic, and rubber.

Example configurable electronics packages (or portions thereof) described herein can be made from a single piece (as from a mold, injection mold, die cast, or extrusion process). In addition, or in the alternative, example configurable electronics packages (or portions thereof) can be made from multiple pieces that are connected to each other. In such a case, the multiple pieces can be connected to each other using one or more of a number of connection methods, including but not limited to epoxy, welding, fastening devices, detents, compression fittings, mating threads, and slotted fittings. One or more pieces that are connected to each other can be connected to each other in one or more of a number of ways, including but not limited to fixedly, hingedly, removeably, slidably, and threadably.

A connection feature (including a complementary connection feature) as described herein can allow one or more components and/or portions of an example configurable electronics package to become connected, mechanically and/or electrically, to another configurable electronics package and/or another component of the electrical device (e.g., a housing). A connection feature can include, but is not limited to, a portion of a hinge, an aperture, a recessed area, a protrusion, a slot, a spring clip, a male connector end, a female connector end, a tab, a detent, and mating threads. One portion of an example light fixture can be connected to another portion of the light fixture by the direct use of one or more connection features.

In addition, or in the alternative, a portion of an example configurable electronics package can be connected to another configurable electronics package and/or another component (e.g., a housing) of the electrical device using one or more independent connection devices that interact with one or more connection features disposed on the configurable electronics package. Examples of such devices can include, but are not limited to, a pin, a male connector end, a female connector end, a hinge, epoxy, adhesive, tape, welding, a fastening device (e.g., a bolt, a screw, a rivet), and a spring. One connection feature described herein can be the same as, or different than, one or more other connection features described herein. A complementary connection feature as described herein can be a connection feature that connects, mechanically and/or electrically, with another connection feature. A connection feature can be made of, at least in part, an electrically-conductive material.

In the foregoing figures showing example embodiments of configurable electronics packages, one or more of the components shown may be omitted, repeated, and/or substituted. Accordingly, example embodiments of configurable electronics packages should not be considered limited to the specific arrangements of components shown in any of the figures. For example, features shown in one or more figures or described with respect to one embodiment can be applied to another embodiment associated with a different figure or description.

Example configurable electronics packages described herein can be used to serve one or more of a number of functions used to operate the electrical device in which they are disposed. Such functions can include, but are not limited to, control, power supply, power storage, sensing, a safety barrier, and timing.

In certain example embodiments, electrical devices having example embodiments are subject to meeting certain standards and/or requirements. For example, the National Electric Code (NEC), the National Electrical Manufacturers Association (NEMA), the International Electrotechnical Commission (IEC), Underwriters Laboratories (UL), the Federal Communication Commission (FCC), the Illuminating Engineering Society (IES), and the Institute of Electrical and Electronics Engineers (IEEE) set standards as to electrical enclosures, wiring, and electrical connections. Use of example embodiments described herein meet (and/or allow a corresponding device to meet) such standards when required. In some (e.g., PV solar) applications, additional standards particular to that application may be met by the electrical enclosures described herein.

For example, the housing of an electrical device in which example embodiments are disposed can meet the NEMA 4X standard. In such a case, the housing of the electrical device is constructed to provide a degree of protection to the example configurable electronics packages disposed within the housing against, at least, corrosion, falling dirt, rain, sleet, snow, ice, windblown dust, splashing water, and hose-directed water. As a specific example, a light fixture with a NEMA 4X rating can provide protection with respect to harmful effects on the example configurable electronics packages disposed within the housing due to ingress of water. Thus, a housing that encloses example configurable electronics packages must also meet these standards and/or allow the resulting electrical device to meet these standards. In some cases, example configurable electronics packages undergo specialized processing (e.g., encased in potting material) to help the electrical device comply with applicable standards.

As discussed above, an electrical device that includes example configurable electronics packages can be located in any type of environment (e.g., indoors, outdoors, under water, in a climate controlled room). In addition, or in the alternative, electrical devices with example configurable electronics packages can be located in hazardous and/or marine environments. As defined herein, a hazardous location is any location where the electrical device that includes example configurable electronics packages can be exposed to extreme conditions. Extreme conditions can include, but are not limited to, high temperatures, low temperatures, temperature fluctuations, corrosion, humidity, chemicals, chemical vapors, vibrations, and dust. More information about hazardous locations and hazardous location enclosures can be found, for example, in Articles 500-506 and Articles 510-517 of the National Electric Code, which is incorporated herein by reference.

A hazardous environment can include an explosive environment, which would require an electrical device having example configurable electronics packages to meet one or more requirements, including but not limited to maintaining flame paths. An explosion-proof enclosure is a type of hazardous location electrical enclosure (e.g., a light fixture). In one or more example embodiments, an explosion-proof enclosure (also known as a flame-proof enclosure) is an electrical enclosure that is configured to contain an explosion that originates inside the enclosure. Further, the explosion-proof enclosure is configured to allow gases from inside the explosion-proof enclosure to escape across joints (also called gaps herein) of the explosion-proof enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more example embodiments, an explosion-proof enclosure (which can include the housing of an electrical device in which example configurable electronics packages are disposed) is subject to meeting certain standards and/or requirements. For example, NEMA sets standards with which an electrical enclosure must comply in order to qualify as an explosion-proof enclosure. Specifically, NEMA Type 7, Type 8, Type 9, and Type 10 enclosures set standards with which an explosion-proof enclosure within certain hazardous locations must comply. For example, a NEMA Type 7 standard applies to electrical enclosures constructed for indoor use in certain hazardous locations. Hazardous locations may be defined by one or more of a number of authorities, including but not limited to the National Electric Code (e.g., Class 1, Division I) and UL (e.g., UL 1203). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes (e.g., greater than 100 in$^3$) may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of configurable electronics packages will be described more fully hereinafter with reference to the accompanying drawings, in which example embodiments of configurable electronics packages are shown. Configurable electronics packages may, however, be embodied in many different forms and should not be construed as limited to the example embodiments set forth herein. Rather, these example embodiments are provided so that this disclosure will be thorough and complete, and will fully convey the scope of configurable electronics packages to those of ordinary skill in the art. Like, but not necessarily the same, elements (also sometimes called components) in the various figures are denoted by like reference numerals for consistency.

Terms such as "first", "second", "top", "bottom", "front", "rear", "side", "end", "left", "right", "outer", "outward", and "within" are used merely to distinguish one component (or part of a component or state of a component) from another. Such terms are not meant to denote a preference or a particular orientation, and are not meant to limit embodiments of configurable electronics packages. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a cross-sectional side view of an electrical device 100 currently used in the art. In this case, the electrical device 100 is a hazardous location light fixture. The electrical device 100 of FIG. 1 includes a housing 110 (also called an enclosure 110) that has at least one wall 111. The one or more walls 111 of the housing 110 form a cavity 112 inside of which multiple components 113 (also called electronics packages 113) are disposed. In the current art, one or more of these electronics packages 113 are designed specifically based on the shape and size of the cavity 112 into which the electronics packages 113 are disposed. In addition, the various electronics packages 113 are not directly connected to each other. Rather, the various electronics packages 113 are either wired to each other using electrical conductors and/or plugged into a common circuit board. Again, this means that the electronics packages 113 in the current art are designed specifically to accommodate the shape and size of the cavity 112 formed by the wall 111 of the enclosure 110.

Figure 2:
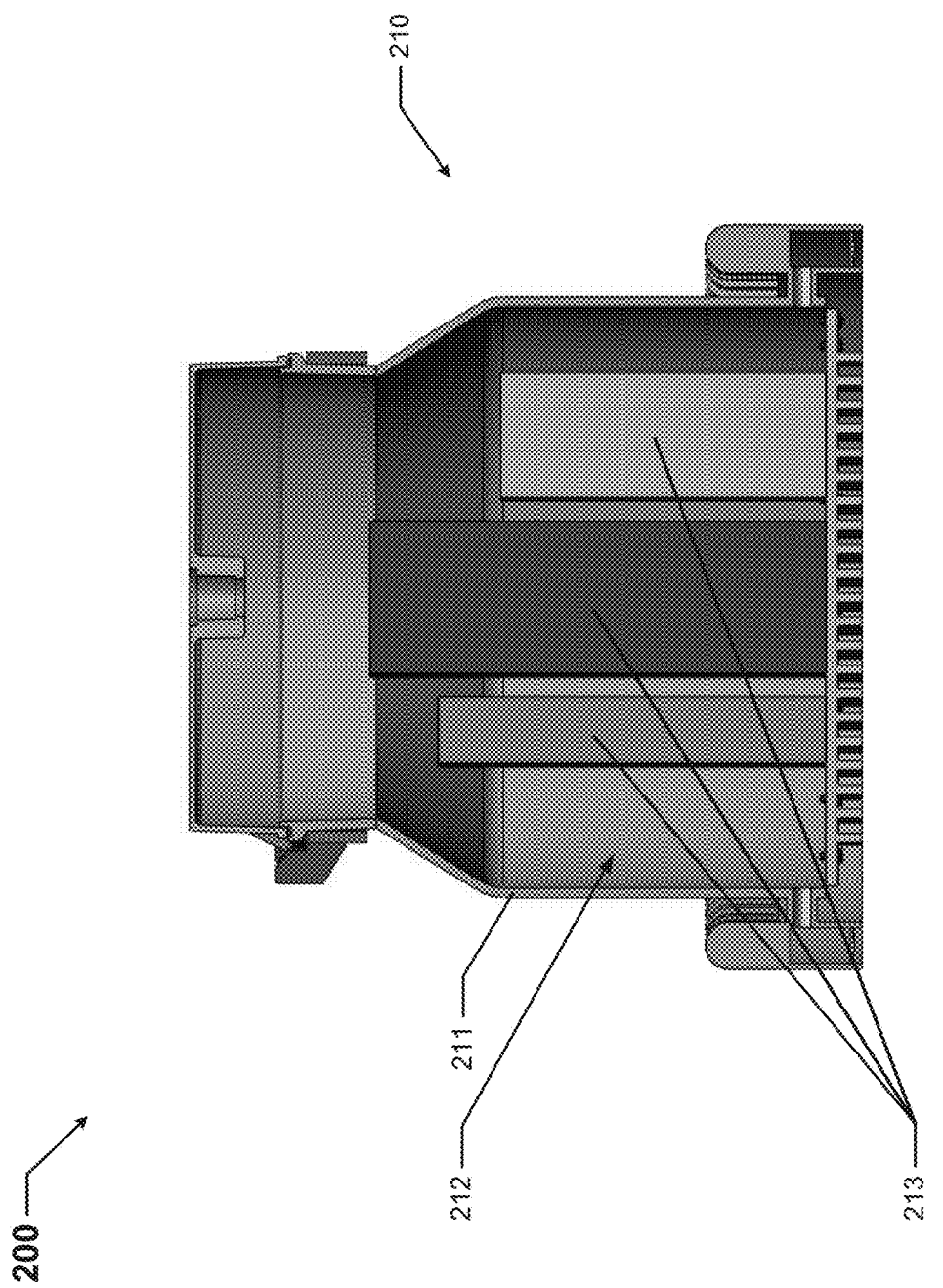
FIG. 2 shows a cross-sectional side view of another electrical device currently used in the art.

FIG. 2 shows a cross-sectional side view of another electrical device 200 currently used in the art. Referring to FIGS. 1 and 2, in this case, the electrical device 200 is a hazardous location light fixture. The electrical device 200 of FIG. 2 includes a housing 210 (also called an enclosure 200) that has at least one wall 211. The one or more walls 211 of the housing 210 form a cavity 212 inside of which multiple components 213 (also called electronics packages 213) are disposed. The functions (e.g., power supply, energy storage, control, sensing) performed by the electronics packages 213 of FIG. 2 are substantially the same as the functions performed by the electronics packages 113 of FIG. 1. In the current art, as with the case described above for the light fixture of FIG. 1, one or more of these electronics packages 213 are designed specifically based on the shape and size of the cavity 212 into which the electronics packages 213 are disposed. In addition, the various electronics packages 213 are not connected to each other. Rather, the various electronics packages 213 are either wired to each other using electrical conductors and/or plugged into a common circuit board. Again, this means that the electronics packages 213 in the current art are designed specifically to accommodate the shape and size of the cavity 212 formed by the wall 211 of the enclosure 210.

FIG. 3 shows a cross-sectional side view of an electrical enclosure 310 with configurable electronics packages 313 in accordance with certain example embodiments. Referring to FIGS. 1-3, the electrical enclosure 310 of FIG. 3 is for of an electrical device. The electrical enclosure 310 includes at least one wall 311 that forms a cavity 312. The walls 311 form a rectangular shape. Inside the cavity 312 in this case are disposed three electronics packages 313 (electronics package 313-1, electronics package 313-2, and electronics package 313-3).

In accordance with example embodiments, the electronics packages 313 are connected (e.g., mechanically, electrically) to each other using example connection features 350. Specifically, electronics package 313-1 and electronics package 313-2 are connected to each other using connection feature 350-1, and electronics package 313-3 and electronics package 313-2 are connected to each other using connection feature 350-2. Connection feature 350-1 can be the same as, or different than, connection feature 350-2. The configuration of the electronics packages 313 is a horizontally-linear alignment within the cavity 312 of the enclosure 310 so that, looking from left to right in FIG. 3, electronics package 313-1 is followed by electronics package 313-2, which is followed by electronics package 313-3. Examples of various connection features 350 are discussed in more detail below.

FIG. 4 shows a cross-sectional side view of the electrical enclosure 310 of FIG. 3 with a different arrangement of the configurable electronics packages 313 in accordance with certain example embodiments. Specifically, the configuration of the electronics packages 313 is still a horizontally-linear alignment within the cavity 312 formed by the walls 311 of the enclosure 310, but in this case, looking from left to right in FIG. 4, electronics package 313-3 is followed by electronics package 313-1, which is followed by electronics package 313-2. Electronics package 313-3 is connected to electronics package 313-1 using connection feature 450-1, and electronics package 313-1 is connected to electronics package 313-2 using connection feature 450-2. Connection feature 450-1 can be the same as, or different than, connection feature 450-2. Similarly, the connection features 450 of FIG. 4 can be the same as, or different than, the connection features 350 of FIG. 3.

FIG. 5 shows a cross-sectional side view of still another electrical enclosure 510 with configurable electronics packages in accordance with certain example embodiments. Referring to FIGS. 1-5, the electrical enclosure 510 of FIG. 5 is for of an electrical device. The electrical enclosure 510 includes at least one wall 511 that forms a cavity 512. The walls 511 form a rectangular shape. Inside the cavity 512 in this case are disposed three electronics packages 513 (electronics package 513-1, electronics package 513-2, and electronics package 513-3).

In accordance with example embodiments, the electronics packages 513 are connected (e.g., mechanically, electrically) to each other using example connection features 550. Specifically, electronics package 513-1 and electronics package 513-2 are connected to each other using connection feature 550-1, and electronics package 513-3 and electronics package 513-2 are connected to each other using connection feature 550-2. Connection feature 550-1 can be the same as, or different than, connection feature 550-2. The configuration of the electronics packages 513 is a vertically-linear alignment within the cavity 512 of the enclosure 510 so that, looking from top to bottom in FIG. 5, electronics package 513-1 is followed by electronics package 513-2, which is followed by electronics package 513-3.

FIG. 6 shows a cross-sectional side view of yet another electrical enclosure 610 with configurable electronics packages 613 in accordance with certain example embodiments. Referring to FIGS. 1-6, the electrical enclosure 610 of FIG. 6 is for of an electrical device. The electrical enclosure 610 includes at least one wall 611 that forms a cavity 612. The walls 611 form a triangular shape. Inside the cavity 612 in this case are disposed three electronics packages 613 (electronics package 613-1, electronics package 613-2, and electronics package 613-3).

In accordance with example embodiments, the electronics packages 613 are connected (e.g., mechanically, electrically) to each other using example connection features 650. Specifically, electronics package 613-1 and electronics package 613-2 are connected to each other using connection feature 650-1, electronics package 613-3 and electronics package 613-1 are connected to each other using connection feature 650-2, and electronics package 613-3 and electronics package 613-2 are connected to each other using connection feature 650-3. One connection feature 650 can be the same as, or different than, one or both of the other connection features 650. The configuration of the electronics packages 613 is a pyramid alignment within the cavity 612 of the enclosure 610 so that electronics package 613-1 is disposed atop electronics package 613-2 and electronics package 613-3.

FIG. 7 shows a cross-sectional side view of still another electrical enclosure 710 with configurable electronics packages 713 in accordance with certain example embodiments. Referring to FIGS. 1-7, the electrical enclosure 710 of FIG. 7 is for of an electrical device. The electrical enclosure 710 includes at least one wall 711 that forms a cavity 712. The walls 711 form a circular shape. Inside the cavity 712 in this case are disposed three electronics packages 713 (electronics package 713-1, electronics package 713-2, and electronics package 713-3).

In accordance with example embodiments, the electronics packages 713 are connected (e.g., mechanically, electrically) to each other using example connection features 750. Specifically, electronics package 713-1 and electronics package 713-2 are connected to each other using connection feature 750-1, and electronics package 713-3 and electronics package 713-2 are connected to each other using connection feature 750-2. Connection feature 750-1 can be the same as, or different than, connection feature 750-2. The configuration of the electronics packages 713 is a circular-shaped alignment within the cavity 712 of the enclosure 710 so that, looking from top to bottom in FIG. 7, electronics package 713-1 is followed by electronics package 713-2, which is followed by electronics package 713-3.

Figure 8:
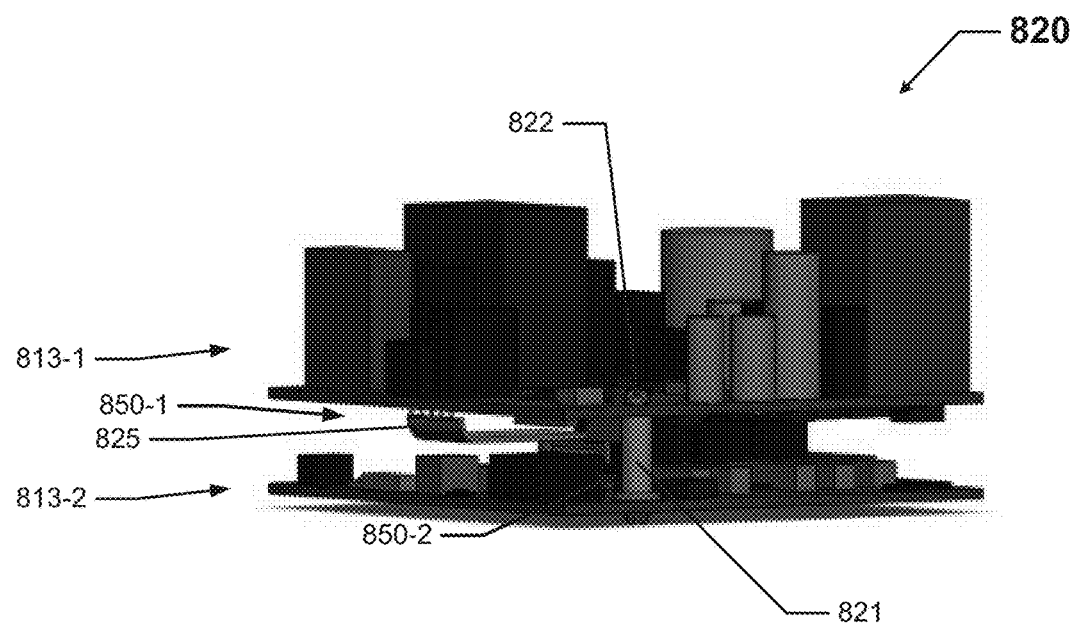
FIG. 8 shows a side view of a set of configurable electronics packages in accordance with certain example embodiments.

FIG. 8 shows a cross-sectional side view of a set 820 of configurable electronics packages 813 in accordance with certain example embodiments. Referring to FIGS. 1-8, there is no enclosure shown in FIG. 8, but the configuration of the set 820 is such as to fit within enclosures of certain shapes and/or sizes. The set 820 of FIG. 8 includes two electronics packages 813 (electronics package 813-1 and electronics package 813-2), and the configuration of the set 820 is that electronics package 813-1 is stacked atop electronics package 813-2.

There are two connection features 850 that connect electronics package 813-1 and electronics package 813-2 to each other. Connection feature 850-1 includes one or more electrical conductors 825 (e.g., a ribbon cable) having leads at one end connected to the bottom of electronics package 813-1, and leads at the opposite end connected to the top of electronics package 813-2. Connection feature 850-2 includes a cylindrical standoff 821 having a pin 822 disposed therein, where each end of the pin 822 traverses and is connected to the circuit board of electronics package 813-1 and electronics package 813-2. In this way, the connection features 850 of the set 820 provide both electrical and mechanical connection between electronics package 813-1 and electronics package 813-2.

Figure 9:
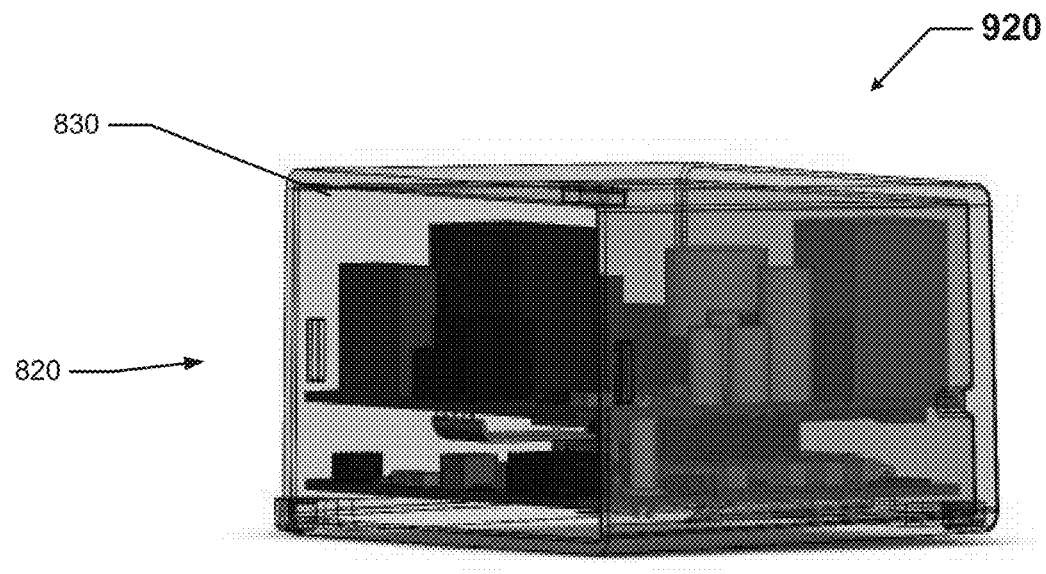
FIG. 9 shows a side view of another set of configurable electronics packages in accordance with certain example embodiments.

FIG. 9 shows a cross-sectional side view of another set of configurable electronics packages in accordance with certain example embodiments. Referring to FIGS. 1-9, the set 920 in FIG. 9 includes the set 820 of FIG. 8 with encasement 830. The encasement 830 can be a housing, potting material, or some similar component and/or material. The encasement 830 can act merely as a shell that encases the set 820. Alternatively, the encasement 830 can serve as a protective barrier for some or all of the components disposed on electronics package 813-1 and/or electronics package 813-2.

In some cases, an encasement 830 can include one or more connection features that allow one or more electronics packages 1813 to connect (e.g., mechanically, electrically) to another encasement and/or electronics package. For example, there can be an aperture that traverses some or all of an encasement 830, where the aperture receives a fastening device (e.g., a screw, a bolt). When such an aperture aligns with an aperture of another encasement and/or electronics package, the fastening device can be used to connect the encasement 830 to the other encasement and/or electronics package. As another example, there can be a clip disposed on an outer surface of the encasement 830 that can connect to another encasement and/or electronics package.

Figure 10:
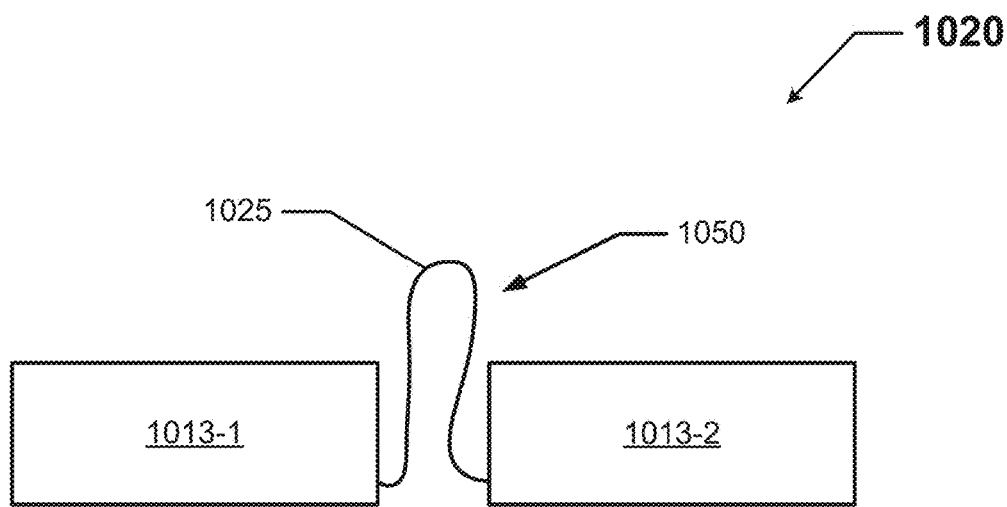
FIG. 10 shows a cross-sectional side view of still another set of configurable electronics packages in accordance with certain example embodiments.

FIG. 10 shows a cross-sectional side view of still another set 1020 of configurable electronics packages 1013 in accordance with certain example embodiments. Referring to FIGS. 1-10, there is no enclosure shown in FIG. 10, but the configuration of the set 1020 is such as to fit within enclosures of a certain shapes and/or sizes. The set 1020 of FIG. 10 includes two electronics packages 1013 (electronics package 1013-1 and electronics package 1013-2), and the configuration of the set 1020 is that electronics package 1013-1 and electronics package 1013-2 are aligned end-to-end relative to each other.

There is one connection feature 1050 that connects electronics package 1013-1 and electronics package 1013-2 to each other. The connection feature 1050 includes one or more electrical conductors 1025 having leads at one end connected to an end of electronics package 1013-1, and leads at the opposite end connected to an end of electronics package 1013-2. The connection feature 1050 in this case is flexible, and so the location of electronics package 1013-1 relative to electronics package 1013-2 is adjustable. In this way, the connection feature 1050 of the set 1020 provides electrical, but not necessarily mechanical, connection between electronics package 1013-1 and electronics package 1013-2.

Figure 11:
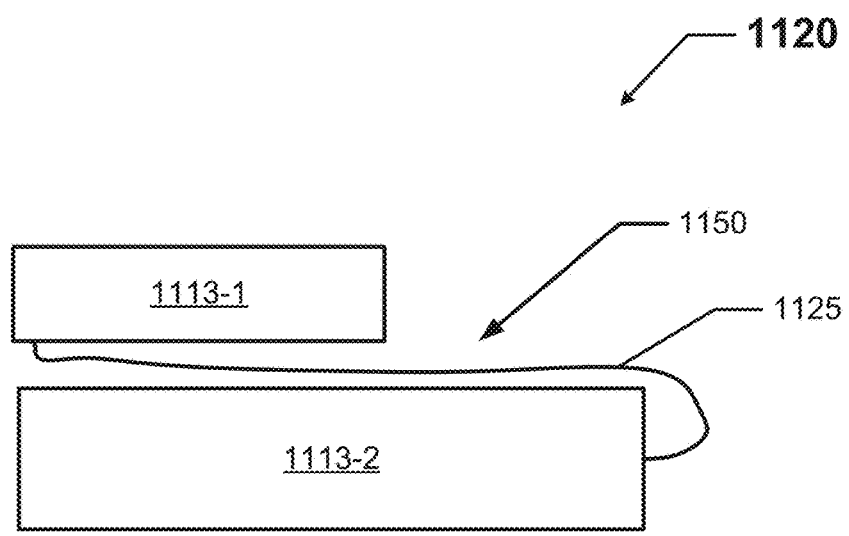
FIG. 11 shows a cross-sectional side view of yet another set of configurable electronics packages in accordance with certain example embodiments.

FIG. 11 shows a cross-sectional side view of yet another set 1120 of configurable electronics packages 1113 in accordance with certain example embodiments. Referring to FIGS. 1-11, there is no enclosure shown in FIG. 11, but the configuration of the set 1120 is such as to fit within enclosures of a certain shapes and/or sizes. The set 1120 of FIG. 11 includes two electronics packages 1113 (electronics package 1113-1 and electronics package 1113-2), and the configuration of the set 1120 is that electronics package 1113-1 is disposed above electronics package 1113-2.

There is one connection feature 1150 that connects electronics package 1113-1 and electronics package 1113-2 to each other. The connection feature 1150 includes one or more electrical conductors 1125 having leads at one end connected to the bottom of electronics package 1113-1, and leads at the opposite end connected to an end of electronics package 1113-2. The connection feature 1150 in this case is flexible, and so the location of electronics package 1113-1 relative to electronics package 1113-2 is adjustable. In this way, the connection feature 1150 of the set 1120 provides electrical, but not necessarily mechanical, connection between electronics package 1113-1 and electronics package 1113-2.

Figure 12:
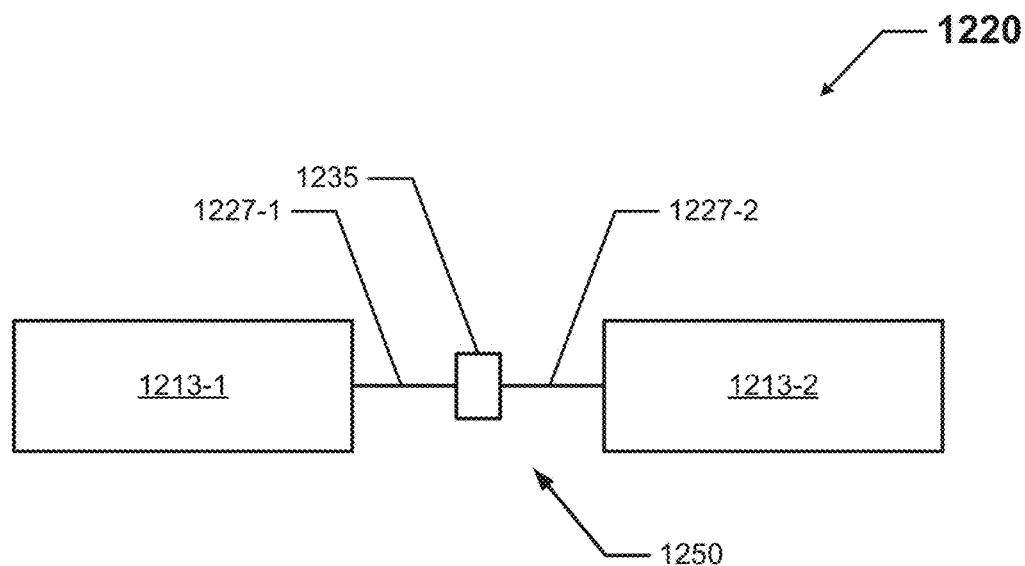
FIG. 12 shows a cross-sectional side view of still another set of configurable electronics packages in accordance with certain example embodiments.

FIG. 12 shows a cross-sectional side view of still another set 1220 of configurable electronics packages 1213 in accordance with certain example embodiments. Referring to FIGS. 1-12, there is no enclosure shown in FIG. 12, but the configuration of the set 1220 is such as to fit within enclosures of a certain shapes and/or sizes. The set 1220 of FIG. 12 includes two electronics packages 1213 (electronics package 1213-1 and electronics package 1213-2), and the configuration of the set 1220 is that electronics package 1213-1 and electronics package 1213-2 are aligned end-to-end relative to each other.

There is one connection feature 1250 that connects electronics package 1213-1 and electronics package 1213-2 to each other. The connection feature 1250 includes one or more leads 1227 extending from an electronics package 1213 and an electrical connector 1235 to which each lead 1227 connects. Specifically, lead 1227-1 extends from an end of electronics package 1213-1 and connects to (e.g., plugs into) electrical connector 1235, and lead 1227-2 extends from an end of electronics package 1213-2 and connects to (e.g., plugs into) electrical connector 1235. The connection feature 1250 (specifically, the leads 1227) in this case can be rigid or flexible. As a result, the location of electronics package 1213-1 relative to electronics package 1213-2 can be fixed or adjustable. In this way, the connection feature 1250 of the set 1220 provides electrical, and in some cases also mechanical, connection between electronics package 1213-1 and electronics package 1213-2. In certain example embodiments, the length (e.g., between where lead 1227-1 and lead 1227-2 are received) of the electrical connector 1235 can be adjusted by a user.

Figure 13:
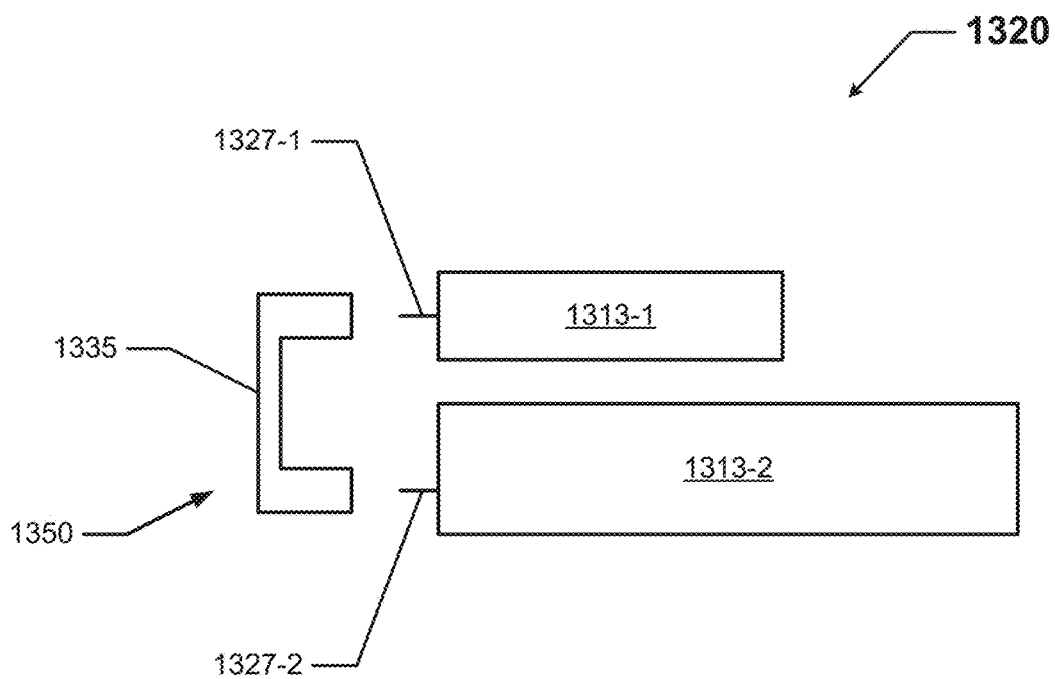
FIG. 13 shows a cross-sectional side view of yet another set of configurable electronics packages in accordance with certain example embodiments.

FIG. 13 shows a cross-sectional side view of yet another set 1320 of configurable electronics packages 1313 in accordance with certain example embodiments. Referring to FIGS. 1-13, there is no enclosure shown in FIG. 13, but the configuration of the set 1320 is such as to fit within enclosures of a certain shapes and/or sizes. The set 1320 of FIG. 13 includes two electronics packages 1313 (electronics package 1313-1 and electronics package 1313-2), and the configuration of the set 1320 is that electronics package 1313-1 is disposed above electronics package 1313-2.

There is one connection feature 1350 that connects electronics package 1313-1 and electronics package 1313-2 to each other. The connection feature 1350 includes one or more leads 1327 extending from an electronics package 1313 and an electrical connector 1335 to which each lead 1327 connects. Specifically, lead 1327-1 extends from an end of electronics package 1313-1 and connects to (e.g., plugs into) one end of electrical connector 1335, and lead 1327-2 extends from an end of electronics package 1313-2 and connects to (e.g., plugs into) the opposing end of electrical connector 1335.

The connection feature 1350 (specifically, the leads 1327) in this case can be rigid or flexible. In addition, in this case, the electrical connector 1335 is rigid and U-shaped. As a result, the location of electronics package 1313-1 relative to electronics package 1313-2 is substantially fixed by the rigidity of the electrical connector 1335. In this way, the connection feature 1350 of the set 1320 provides electrical and mechanical connection between electronics package 1313-1 and electronics package 1313-2. In certain example embodiments, the length (e.g., between where lead 1327-1 and lead 1327-2 are received) of the electrical connector 1335 can be adjusted by a user.

Figure 14:
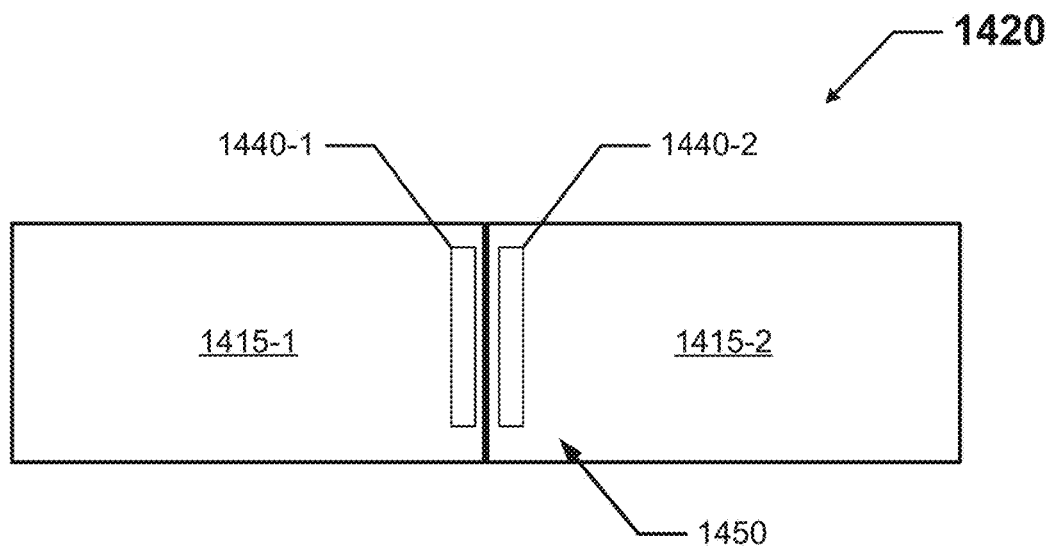
FIG. 14 shows a cross-sectional side view of still another set of configurable electronics packages in accordance with certain example embodiments.

FIG. 14 shows a cross-sectional side view of still another set 1420 of configurable electronics packages 1413 in accordance with certain example embodiments. Referring to FIGS. 1-14, there is no enclosure shown in FIG. 14, but the configuration of the set 1420 is such as to fit within enclosures of a certain shapes and/or sizes. The set 1420 of FIG. 14 includes two electronics packages 1413 (electronics package 1413-1 and electronics package 1413-2), and the configuration of the set 1420 is that electronics package 1413-1 and electronics package 1413-2 are aligned end-to-end relative to each other.

There is one connection feature 1450 that connects electronics package 1413-1 and electronics package 1413-2 to each other. The connection feature 1450 in this case includes two magnets 1440. Magnet 1440-1 is embedded in electronics package 1413-1, and magnet 1440-2 is embedded in electronics package 1413-2. When magnet 1440-1 has a polarity that is opposite the polarity of magnet 1440-2, the magnets 1440 become attracted to each other when they are disposed close enough to each other. Each electronics package 1413 can have multiple magnets 1440 embedded therein and/or disposed thereon. In some cases, the position of a magnet 1440 on an electronics package 1413 can be determined (e.g., changed) by a user. In this way, once the magnetic fields of the opposing magnets 1440 are within range of each other, the location of electronics package 1413-1 relative to electronics package 1413-2 is fixed. In this way, the connection feature 1450 of the set 1420 provides mechanical, but not electrical, connection between electronics package 1413-1 and electronics package 1413-2.

As an alternative embodiment, the connection feature 1450 can include a transmitter 1440-1 and a receiver 1440-2 used for wireless power transfer from one electronics package (e.g., electronics package 1413-1) to the other electronics package (e.g., electronics package 1413-2). In such a case, the wireless power transfer can be performed using any of a number of technologies, including but not limited to inductive coupling, resonant inductive coupling, and capacitive coupling. In this example embodiment, the connection feature 1450 of the set 1420 provides electrical, but not mechanical, connection between electronics package 1413-1 and electronics package 1413-2. In such a case, there can be other means of mechanical connection (e.g., fastening devices, such as screws, tape, or bolts).

Figure 15:
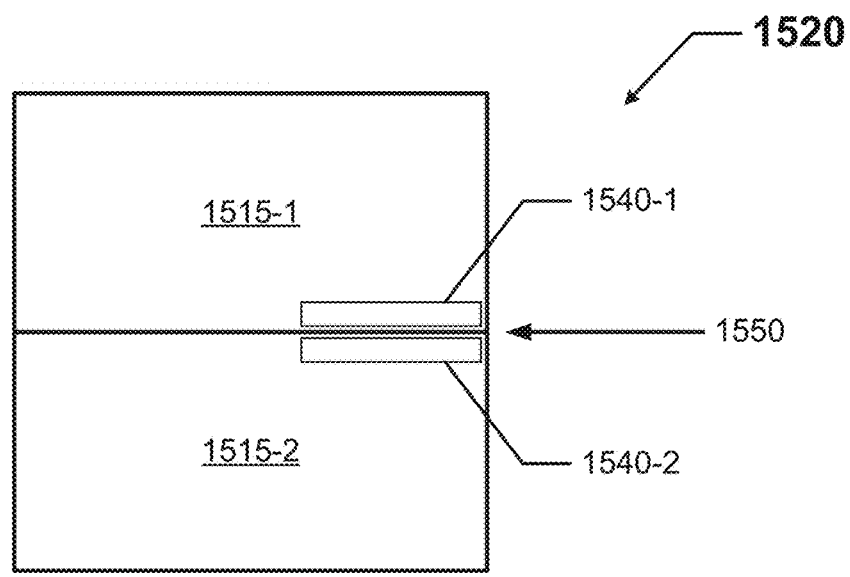
FIG. 15 shows a cross-sectional side view of yet another set of configurable electronics packages in accordance with certain example embodiments.

FIG. 15 shows a cross-sectional side view of yet another set 1520 of configurable electronics packages 1513 in accordance with certain example embodiments. Referring to FIGS. 1-15, there is no enclosure shown in FIG. 15, but the configuration of the set 1520 is such as to fit within enclosures of a certain shapes and/or sizes. The set 1520 of FIG. 15 includes two electronics packages 1513 (electronics package 1513-1 and electronics package 1513-2), and the configuration of the set 1520 is that electronics package 1513-1 is disposed above electronics package 1513-2.

There is one connection feature 1550 that connects electronics package 1513-1 and electronics package 1513-2 to each other. The connection feature 1550 in this case includes two magnets 1540. Magnet 1540-1 is embedded in electronics package 1513-1, and magnet 1540-2 is embedded in electronics package 1513-2. When magnet 1540-1 has a polarity that is opposite the polarity of magnet 1540-2, the magnets 1540 become attracted to each other when they are disposed close enough to each other. Each electronics package 1513 can have multiple magnets 1540 embedded therein and/or disposed thereon. In some cases, the position of a magnet 1540 on an electronics package 1513 can be determined (e.g., changed) by a user. In this way, once the magnetic fields of the opposing magnets 1540 are within range of each other, the location of electronics package 1513-1 relative to electronics package 1513-2 is fixed. In this way, the connection feature 1550 of the set 1520 provides mechanical, but not electrical, connection between electronics package 1513-1 and electronics package 1513-2.

Figure 16:
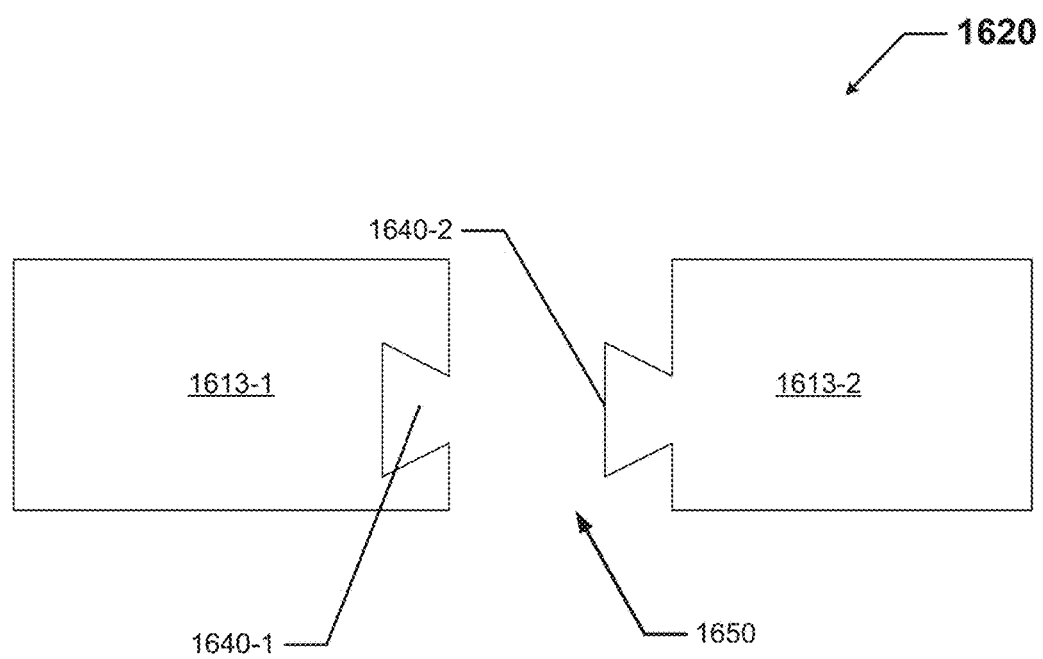
FIG. 16 shows a cross-sectional side view of still another set of configurable electronics packages in accordance with certain example embodiments.

FIG. 16 shows a cross-sectional side view of still another set 1620 of configurable electronics packages 1613 in accordance with certain example embodiments. Referring to FIGS. 1-16, there is no enclosure shown in FIG. 16, but the configuration of the set 1620 is such as to fit within enclosures of a certain shapes and/or sizes. The set 1620 of FIG. 16 includes two electronics packages 1613 (electronics package 1613-1 and electronics package 1613-2), and the configuration of the set 1620 is that electronics package 1613-1 and electronics package 1613-2 are aligned end-to-end relative to each other.

There is one connection feature 1650 that connects electronics package 1613-1 and electronics package 1613-2 to each other. The connection feature 1650 includes a protrusion 1640-2 in a surface (e.g., an end) of one electronics package (in this case, electronics package 1613-2), and a recess 1640-1 in a surface (e.g., an end) of the other electronics package (in this case, electronics package 1613-1). The shape and size of the protrusion 1640-2 complements the shape and size of the recess 1640-1. Also, the shape (e.g., dovetail) of the protrusion 1640-2 and the recess 1640-1 is such that, once the protrusion 1640-2 is seated within (connected to) the recess 1640-1, only a specific movement of one electronics package 1613 relative to the other will disconnect them.

In some cases, the protrusion 1640-2 and the recess 1640-1 can have one or more of a number of electrically conductive surfaces that can transfer power between the electronics packages 1613 when the protrusion 1640-2 and the recess 1640-1 are connected to each other. In this way, the location of electronics package 1613-1 relative to electronics package 1613-2 can be fixed, and the connection feature 1650 of the set 1620 provides mechanical, and in some cases also electrical, connection between electronics package 1613-1 and electronics package 1613-2.

While the various connection features discussed above provide context to example embodiments, it is also important to describe what example embodiments do not encompass. Specifically, example embodiments and related connection features are not, and do not involve, headers or similar concepts. For example, with computers and similar devices, it is common to have a header or similar feature that has a number of electrical connector ends (e.g., USB ports, RS232 connectors, terminal blocks) that can receive any of a number of components (e.g., circuit boards, peripheral devices). In this case, most often used with computers, the header is used to allow a user flexibility as to the type, capability, and number of components (e.g., circuit boards) that can be used. The housing of a computer is fixed, and there is often plenty of space for accommodating those components. Also, because the position of the header within the electrical device is fixed, the arrangement of the components connected to the header are essentially fixed (subject to their arrangement on the header relative to each other).

By contrast, with the electrical devices for which example embodiments are used, the connection features are used to directly fix a position of one electronics package relative to another electronics package. In addition, in some cases, the connection between electronics packages using example connection features provide direct electrical connection between those electronics packages. The concept captured here is that electronics packages, each serving one or more functions that are common between various electrical devices having housings of various sizes, can be uniquely arranged with respect to each other within such housings using example connection features.

Example embodiments can allow for increased design flexibility among electrical devices that have housings of different shapes and sizes. Example embodiments promote a modular approach to building electrical devices without having to have specially-designed electronics packages. Example embodiments can be used with electrical devices that are located in hazardous and other extreme environments. Example embodiments, allow for modular configurations of an electrical device (or portions thereof) while allowing the electrical device to comply with applicable standards. Such a feature allows for flexible designs, both electrically and mechanically.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An electrical device comprising:
   a first housing comprising at least one wall that forms a first cavity, wherein the first cavity formed by the at least one wall has a first shape and a first size; and
   a plurality of configurable electronics packages disposed within the first cavity, wherein the plurality of configurable electronics packages are directly mechanically coupled to each other and positioned in a first orientation within the first cavity,
   wherein the plurality of configurable electronics packages are configured to be directly mechanically coupled to each other and positioned in a second orientation within a second cavity of a second housing, wherein the second cavity has a second shape and a second size,
   wherein the plurality of configurable electronics packages comprises a first configurable electronics package and a second configurable electronics package, wherein the first configurable electronics package serves a first function, wherein the second configurable electronics package serves a second function,
   wherein the first function comprises power conversion, and wherein the second function comprises a control function and uses power generated by the power conversion.

2. The electrical device of claim 1, wherein the first configurable electronics package comprises a first connector end, wherein the second configurable electronics package comprises a second connector end and a third connector end, wherein the first connector end and the second connector end are connected to each other when the first configurable electronics package and the second configurable electronics package are in the first orientation, and wherein the first connector end and the third connector end are connected to each other when the first configurable electronics package and the second configurable electronics package are in the second orientation.

3. The electrical device of claim 2, wherein the first connector end is integrated with and disposed at multiple locations on the first configurable electronics package.

4. The electrical device of claim 3, wherein the first connector end and the second connector end are directly connected to each other.

5. The electrical device of claim 3, wherein the first configurable electronics package further comprises an electrical conductor disposed between the first connector end and a circuit board.

6. The electrical device of claim 3, further comprising:
   a connection device that connects to the first connector end and the second connector end.

7. The electrical device of claim 6, wherein the connection device is rigid.

8. The electrical device of claim 6, wherein the connection device is flexible.

9. The electrical device of claim 8, wherein the first connector end is integrated with and disposed at multiple locations on the first configurable electronics package.

10. The electrical device of claim 1, wherein the plurality of configurable electronics packages comprises a first configurable electronics package and a second configurable electronics package, wherein the first configurable electronics package comprises a first magnet, wherein the second configurable electronics package comprises a second magnet and a third magnet, wherein the first magnet and the second magnet are attracted to each other to connect the first configurable electronics package and the second configurable electronics package to each other in the first configuration, and wherein the first magnet and the third magnet are attracted to each other to connect the first configurable electronics package and the second configurable electronics package to each other in the second configuration.

11. The electrical device of claim 10, wherein the first configurable electronics package further comprises a transmitter, wherein the second configurable electronics package further comprises a first receiver and a second receiver, wherein the transmitter and the first receiver are used to inductively transfer power from the first configurable electronics package to the second configurable electronics package in the first configuration, and wherein the transmitter and the second receiver are used to inductively transfer power from the first configurable electronics package and the second configurable electronics package to each other in the second configuration.

12. The electrical device of claim 10, wherein there is no transfer of power between the first configurable electronics package and the second configurable electronics package when the first configurable electronics package and the second configurable electronics package are connected to each other in the first configuration and in the second configuration.

13. The electrical device of claim 1, wherein each of the plurality of configurable electronics packages are surrounded by potting material.

14. The electrical device of claim 1, wherein the plurality of configurable electronics packages comprises a first configurable electronics package and a second configurable electronics package, wherein the first configurable electronics package and the second configurable electronics package are stacked one atop another in the first configuration, and wherein the first configurable electronics package and the second configurable electronics package are aligned side-by-side relative to each other in the second configuration.

15. A configurable electronics package for an electrical device, wherein the configurable electronics package comprises:
   a circuit board;
   a plurality of electrical components disposed on the circuit board, wherein the plurality of electrical components is configured to perform a first function for the electrical device, wherein the first function comprises power conversion; and
   at least one connector disposed on the circuit board, wherein the at least one connector is configured to directly mechanically couple, without an independent coupling component, to at least one complementary connector disposed on an additional circuit board of at least one additional configurable electronic package,
   wherein the circuit board, the plurality of electrical components, and the at least one connector are configured to be disposed within a first housing of the electrical device in a first orientation with respect to the at least one additional configurable electronic package, wherein the at least one additional configurable electronics package is configured to perform a second function for the electrical device, wherein the second function comprises a control function, and
   wherein the circuit board, the plurality of electrical components, and the at least one connector are configured to be disposed within a second housing of another electrical device in a second orientation with respect to the at least one additional configurable electronic package.

16. The configurable electronics package of claim 15, wherein the at least one connector is further configured to electrically connect to the at least one complementary connector of the at least one additional configurable electronic package in the first orientation and in the second orientation.

17. The configurable electronics package of claim 15, wherein the first function for the electrical device further comprises at least one selected from a group consisting of sensing, timing, and communication.

18. A configurable electronics package for an electrical device, wherein the configurable electronics package comprises:
   a circuit board;
   a plurality of electrical components disposed on the circuit board, wherein the plurality of electrical components is configured to perform a first function for the electrical device, wherein the first function comprises a control function; and
   at least one connector disposed on the circuit board, wherein the at least one connector is configured to directly mechanically couple, without an independent coupling component, to at least one complementary connector disposed on an additional circuit board of at least one additional configurable electronic package,
   wherein the circuit board, the plurality of electrical components, and the at least one connector are configured to be disposed within a first housing of the electrical device in a first orientation with respect to the at least one additional configurable electronic package, wherein the at least one additional configurable electronics package is configured to perform a second function for the electrical device, wherein the second function comprises power conversion, and
   wherein the circuit board, the plurality of electrical components, and the at least one connector are configured to be disposed within a second housing of another electrical device in a second orientation with respect to the at least one additional configurable electronic package.

* * * * *